(12) United States Patent
Han

(10) Patent No.: US 7,563,660 B2
(45) Date of Patent: Jul. 21, 2009

(54) SILICON FILM, CRYSTALLINE FILM AND METHOD FOR MANUFACTURING THE SAME

(75) Inventor: Jai-Yong Han, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 422 days.

(21) Appl. No.: 11/326,171

(22) Filed: Jan. 6, 2006

(65) Prior Publication Data

US 2006/0154452 A1    Jul. 13, 2006

(30) Foreign Application Priority Data

Jan. 8, 2005    (KR) ...................... 10-2005-0001946

(51) Int. Cl.
*H01L 21/00*    (2006.01)
(52) U.S. Cl. ............................... 438/166; 257/E29.151
(58) Field of Classification Search ......... 438/149–167; 257/E29.151
See application file for complete search history.

(56) References Cited

U.S. PATENT DOCUMENTS 5,492,859 A * 2/1996 Sakaguchi et al. .......... 438/459

FOREIGN PATENT DOCUMENTS

JP           10214790 A * 8/1998

* cited by examiner

*Primary Examiner*—Brook Kebede
(74) *Attorney, Agent, or Firm*—Harness, Dickey & Pierce, P.L.C.

(57) ABSTRACT

A silicon film, crystalline film and method for manufacturing the same are provided. The silicon film and/or crystalline film may be an epitaxy-formed layer. A method for manufacturing a silicon film and/or crystalline film may include forming a insulating substrate, forming a buffer layer using a material selected from the group consisting of metals, compounds and/or oxides on the insulating substrate, crystallizing the buffer layer by annealing, and forming a crystalline and/or silicon film by epitaxy. Silicon and crystalline films manufactured by the method provided may have greater crystallinity, greater uniformity and/or higher charge carrier mobility.

23 Claims, 3 Drawing Sheets

SILICON FILM, CRYSTALLINE FILM AND METHOD FOR MANUFACTURING THE SAME

PRIORITY STATEMENT

This application claims the benefit of Korean Patent Application No. 10-2005-0001946, filed on Jan. 8, 2005, in the Korean Intellectual Property Office, the contents of which are incorporated by reference.

BACKGROUND OF THE INVENTION

1. Field of the Invention

Example embodiments of the present invention relate to a silicon film, crystalline film and method for manufacturing the same. Other example embodiments of the present invention relate to a method of manufacturing a silicon film and/or crystalline film having greater crystallinity, greater uniformity and/or higher charge carrier mobility on a heat-sensitive substrate.

2. Description of the Related Art

Poly-crystalline silicon (poly-Si) may be used in electronic devices (e.g., flat display devices or solar cells) because it may provide higher charge carrier mobility than amorphous silicon (a-Si). Poly-crystalline silicon may have a higher charge carrier mobility and/or greater uniformity compared to single crystal silicon.

Single crystal silicon may be useful for a system-on-panel (SOP) structure in which a system may be formed on a display panel. The charge carrier mobility of the single crystal silicon may be greater than 300 $cm^2/Vs$, which may allow for the manufacture of higher quality switching devices for display devices.

To obtain a poly-crystalline silicon film, after forming an amorphous silicon film on a substrate, the amorphous silicon film may be annealed using an excimer laser or a continuous wave (CW) laser. A limited region of the amorphous silicon film may be melted by the laser and crystallized to obtain a poly-crystalline silicon film. Due to costly laser equipment, the conventional method of manufacturing the poly crystalline silicon film may be expensive. Also, because it may be difficult to process a large area of an amorphous silicon film according to conventional methods, a large area of poly-crystalline silicon film may not be obtainable. Grain sizes crystallized by annealing may be limited to approximately 20×3 μm. Therefore, the poly-crystalline silicon films obtained by conventional methods may include a larger number of defects (e.g., grain boundaries that reduce the uniformity and/or charge carrier mobility of the poly crystalline silicon film).

SUMMARY OF THE INVENTION

Example embodiments of the present invention provide a silicon film, crystalline film and method for manufacturing the same.

Other example embodiments of the present invention provide a method of manufacturing a silicon and/or crystalline films that may have higher crystallinity, charge carrier mobility and/or greater uniformity on a heat-sensitive substrate.

An example embodiment of the present invention provides a method of manufacturing a silicon film and/or crystalline film comprising forming an insulating film; forming a buffer layer using a material selected from the group consisting of metals, compounds and/or oxides on the substrate; crystallizing the buffer layer by annealing and/or forming a silicon layer by epitaxy or chemical vapor deposition (CVD) on the crystallized buffer layer. The buffer layer may be formed by sputtering, plasma enhanced chemical vapor deposition (PECVD), chemical beam epitaxy (CBE) or chemical vapor deposition (CVD).

In another example embodiment, the substrate may be an insulator (e.g., glass or plastic) or any material appreciated in the art. The insulating material may be selected from the group consisting of metals, compounds and/or oxides that may have a relatively lower melting point than the silicon and/or crystallizable material.

In another example embodiment of the present invention, crystallizing the buffer layer by annealing may include annealing portions of the buffer layer using a belt shaped annealing unit and/or annealing the entire buffer layer by moving the annealing unit relative, or substantially parallel, to a surface of the buffer layer. In an example embodiment, the annealing unit may be a heater selected from the group consisting of a line heater, a mercury lamp heater, a xenon lamp heater and/or a laser device.

An example embodiment of the present invention provides an epitaxy-formed film comprising an insulating substrate; a buffer layer; and an epitaxy-formed layer. The epitaxy-formed layer may be formed by heating the buffer layer and flowing a gas mixture of a dopant and silicon and/or crystallizable material over the heated buffer layer.

BRIEF DESCRIPTION OF THE DRAWINGS

Example embodiments of the present invention will be more clearly understood from the following detailed description taken in conjunction with the accompanying drawings.

FIGS. 1A through 1E are perspective views illustrating a method of manufacturing a silicon film and/or crystalline film according to example embodiments of the present invention.

DETAILED DESCRIPTION OF EXAMPLE EMBODIMENTS OF THE INVENTION

Figure 1A:
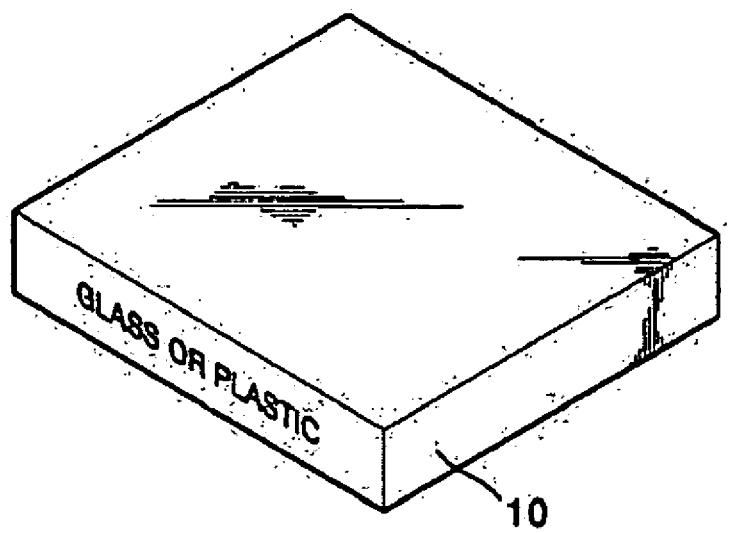
FIGS. 1A through 1E represent non-limiting example embodiments of the present invention as described herein.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Also, the use of the words "compound," "compounds," or "compound(s)," refer to either a single compound or to a plurality of compounds. These words are used to denote one or more compounds but may also just indicate a single compound.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to example embodiments described. In the figures, if a layer is formed on another layer or a substrate, it means that the layer is directly formed on another layer or a substrate, or that a third layer is interposed therebetween. In the following description, the same reference numerals denote the same elements.

According to an example embodiment of the present invention, a silicon film, a crystalline film and a method for manufacturing the same will now be described more fully with reference to the accompanying drawings in which example embodiments of the invention are shown.

FIGS. 1A through 1E are perspective views illustrating a method of manufacturing a silicon film and/or crystalline film according to an embodiment of the present invention. Hereinafter for simplicity, example embodiments of the present invention will refer to the chemical element silicon. It should be appreciated by one skilled in the art that any element, compound or the like, capable of crystallization may be substituted in place of silicon.

Figure 1B:
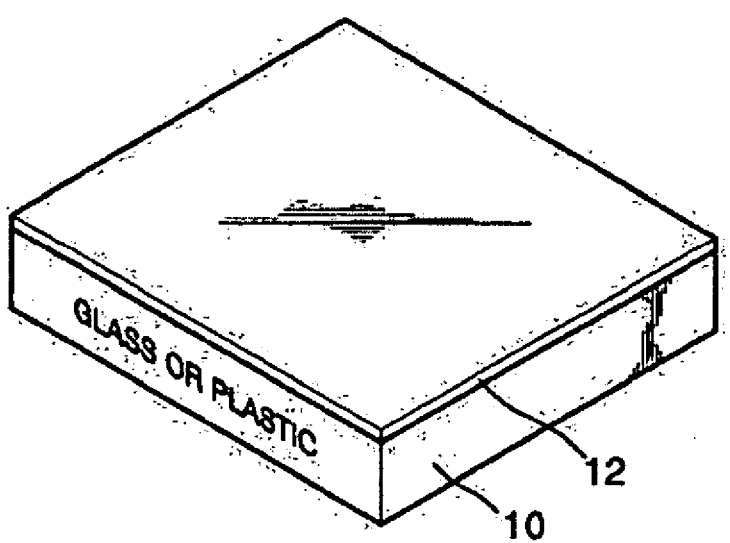

Referring to FIGS. 1A and 1B, an insulating substrate 10, made of any heat-sensitive material including glass, plastic, or any other material appreciated in the art, may be formed. A buffer layer 12, formed of a metal, a compound and/or an oxide may be deposited, or formed, on the insulating substrate 10. The buffer layer may be formed of a material having a melting point relatively lower than the melting point of silicon (e.g., approximately 1410° C. or less) and/or crystallizable material. The buffer layer 12 may be formed using conventional thin film deposition (e.g., plasma enhanced chemical vapor deposition technique (PECVD), chemical vapor deposition (CVD), chemical beam epitaxy (CBE) and/or sputtering). In an alternative embodiment, the buffer layer may be formed according to any method appreciated in the art.

Figure 1C:
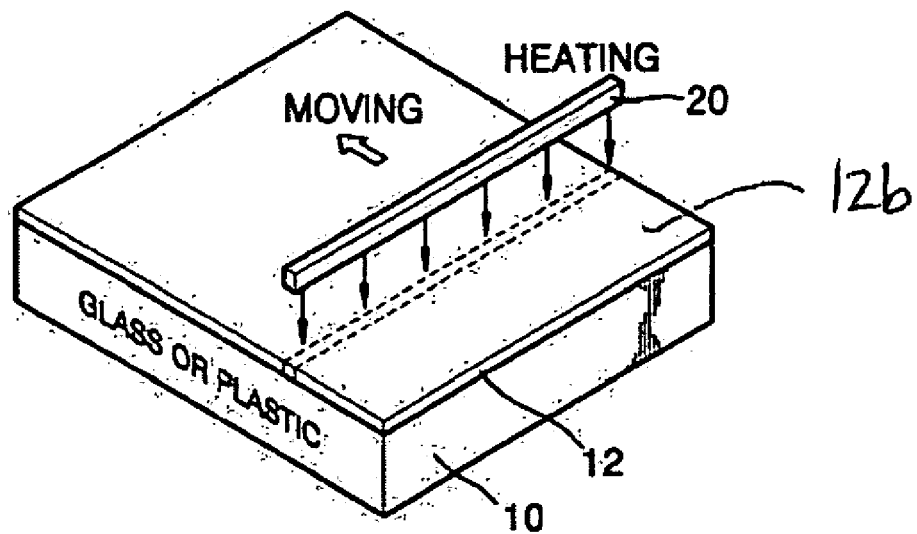
Figure 1D:
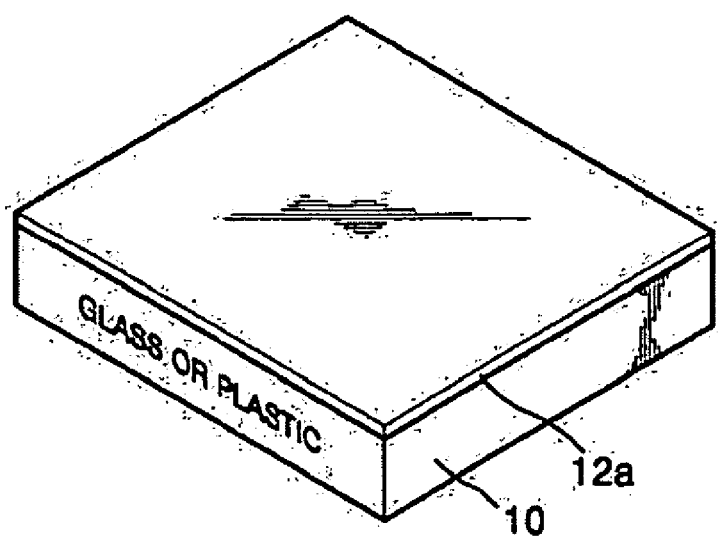

Referring to FIGS. 1C and 1D, the buffer layer 12 may be crystallized by annealing, forming a crystallized buffer layer 12a. The crystallized buffer layer 12a may be formed, or developed, by heating the buffer layer 12. For example, portions of the buffer layer 12 may be annealed using an annealing unit 20 with a particular shape (e.g., belt shaped). The annealing unit 20 may moved relative, or substantially parallel, to a surface 12b of the buffer layer 12. Portions, or the entire, buffer layer 12 may be annealed. The annealing unit 20 may be a line heater, a mercury lamp heater, a xenon lamp heater and/or a laser device. The line heater, the mercury lamp heater, and the xenon lamp heater may reduce the cost of manufacturing silicon films because they are fairly inexpensive pieces of equipment.

Figure 1E:
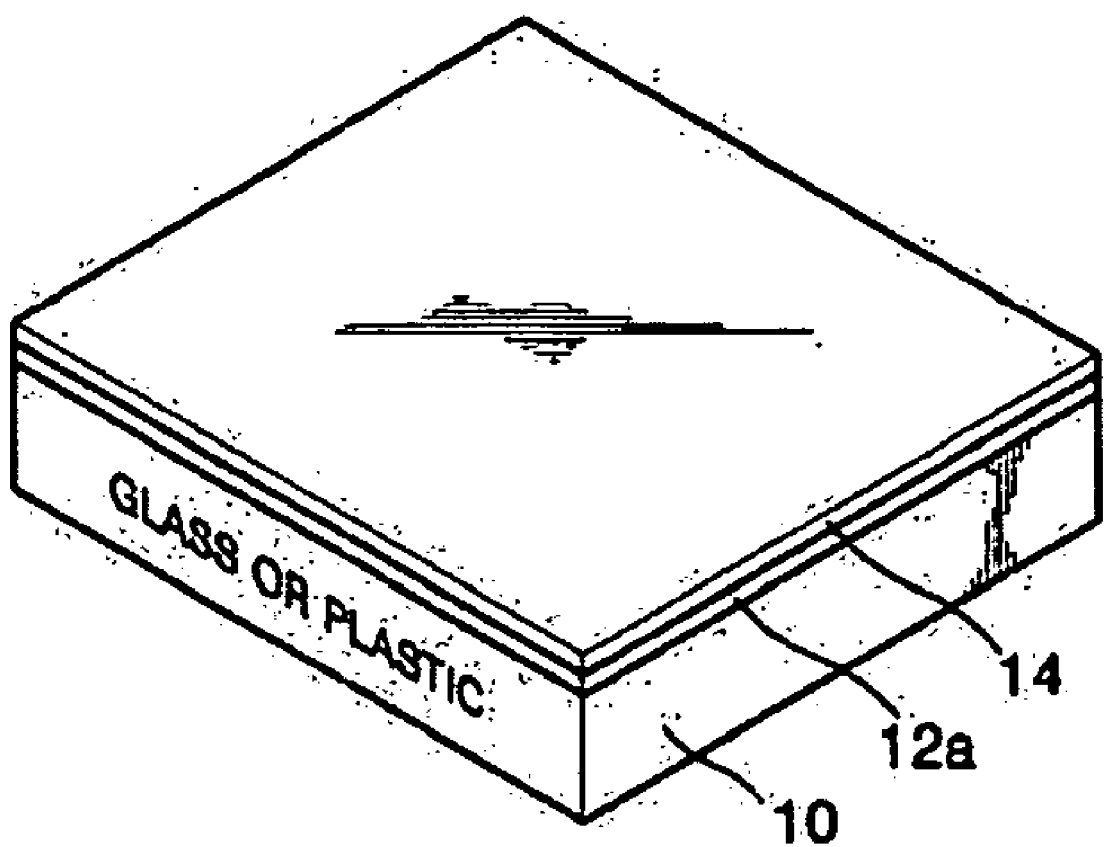

Referring to FIG. 1E, a silicon layer 14 may formed on the crystallized buffer layer 12a by epitaxy. Epitaxy may comprise heating the crystallized buffer layer 12a, etching the heated crystallized buffer layer 12a with a gas (e.g., hydrochloric gas) and/or growing epitaxial layers by flowing a gas mixture that contains silicon and/or a dopant over the heated crystallized buffer layer 12a. The silicon layer 14 may begin to form as a result of the gaseous molecules of the gas mixture may be deposited, or formed, on the heated crystallized buffer layer 12a. Alternatively, the silicon layer 14 may be formed using conventional thin film deposition techniques (e.g., PECVD, CVD, etc). The silicon layer 14 may be formed to a thickness of approximately 100-200 nm. In an alternative embodiment, the silicon layer 14 is a crystalline layer.

According example embodiments to the present invention, a higher quality silicon film may be readily developed, or obtained, on a heat sensitive substrate (e.g., plastic, glass, etc). A single crystal silicon film, or a poly-crystalline silicon film of a substantially equivalent quality to a single crystal silicon film may be obtained because the silicon film may be formed on a crystallized buffer layer by a crystallization method. The silicon film manufactured according to example embodiments of the present invention may have higher crystallinity, uniformity and/or charge carrier mobility. Also, example embodiments of the present invention may allow the use of inexpensive equipment, possibly reducing manufacturing cost.

According to yet another example embodiment of the present invention, a large area silicon film may be formed on a plastic or glass substrate, to be used for a system-on-glass (SOG) or a system-on-plastic (SOP). The method of manufacturing a silicon film according to example embodiments of the present invention may produce higher quality thin film transistors (TFTs) having higher reproducibility and smaller tolerances between parts.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A method of manufacturing a silicon film comprising:
   forming an insulating substrate;
   forming a buffer layer on the insulating substrate, wherein the buffer layer is a material with a lower melting point than silicon, the material being selected from the group consisting of metals, compounds or oxides;
   crystallizing the buffer layer by annealing; and
   forming a silicon layer on the crystallized buffer layer.

2. The method according to claim 1, wherein crystallizing the buffer layer by annealing includes annealing portions of the buffer layer.

3. The method according to claim 1, wherein crystallizing the buffer layer by annealing includes annealing the entire buffer layer.

4. The method according to claim 1, wherein annealing the buffer layer includes moving an annealing unit relative to a surface of the buffer layer, the annealing unit having a belt shape.

5. The method according to claim 4, wherein the annealing unit is a heater selected from the group consisting of a line heater, a mercury lamp heater, a xenon lamp heater or a laser device.

6. The method according to claim 1, wherein the insulating substrate is formed of glass or plastic.

7. The method according to claim 1, wherein forming the silicon layer is performed by epitaxy or chemical vapor deposition.

8. A method of manufacturing a silicon film, comprising:
   forming an insulating substrate;
   forming a buffer layer on the insulating substrate;
   crystallizing the buffer layer by annealing; and
   forming a silicon layer on the crystallized buffer layer by chemical vapor deposition or epitaxy, wherein the epitaxy includes heating the buffer layer, etching the buffer layer with a gas, and forming epitaxial layers on the heated buffer layer, the epitaxial layers forming until the silicon layer has a thickness of approximately 150 nm.

9. The method according to claim 8, wherein the gas is hydrochloric gas.

10. The method according to claim 8, wherein forming the epitaxial layers includes flowing a gas mixture over the heated buffer layer, the gas mixture containing at least silicon and a dopant.

11. The method according to claim 8, wherein crystallizing the buffer layer by annealing includes annealing portions of the buffer layer.

12. The method according to claim 8, wherein crystallizing the buffer layer by annealing includes annealing the entire buffer layer.

13. The method according to claim 8, wherein annealing the buffer layer includes moving an annealing unit relative to a surface of the buffer layer, the annealing unit having a belt shape.

14. The method according to claim 13, wherein the annealing unit is a heater selected from the group consisting of a line heater, a mercury lamp heater, a xenon lamp heater or a laser device.

15. The method according to claim 8, wherein the insulating substrate is formed of glass or plastic.

16. The method according to claim 8, wherein the gas is hydrochloric gas.

17. The method according to claim 8, wherein forming the epitaxial layers includes flowing a gas mixture over the heated buffer layer, the gas mixture containing at least silicon and a dopant.

18. A method of manufacturing a crystalline film comprising:
- forming a substrate;
- forming a buffer layer on a substrate;
- crystallizing the buffer layer by annealing; and
- forming a crystalline layer on the crystallized buffer layer by epitaxy,
- wherein the epitaxy includes heating the crystallized buffer layer, etching the crystallized buffer layer with hydrochloric gas, and growing epitaxial layers on the heated buffer layer by flowing a gas mixture over the heated buffer layer, the gas mixture containing at least one crystallizable material and a dopant.

19. The method according to claim 18, wherein forming the buffer layer includes sputtering, plasma enhanced chemical vapor deposition, chemical beam epitaxy, chemical vapor deposition or chemical vapor deposition.

20. The method according to claim 18, wherein crystallizing the buffer layer includes annealing a partial surface of the buffer layer.

21. The method according to claim 18, wherein crystallizing the buffer layer includes moving an annealing unit substantially parallel to a surface of the buffer layer.

22. The method according to claim 21, wherein the annealing unit is a heater selected from the group consisting of a line heater, a mercury lamp heater, a xenon lamp heater or a laser device.

23. The method according to claim 18, wherein forming the crystalline layer includes a silicon layer.

* * * * *

UNITED STATES PATENT AND TRADEMARK OFFICE
CERTIFICATE OF CORRECTION

PATENT NO. : 7,563,660 B2  Page 1 of 1
APPLICATION NO. : 11/326171
DATED : July 21, 2009
INVENTOR(S) : Jai-Yong Han It is certified that error appears in the above-identified patent and that said Letters Patent is hereby corrected as shown below:

Title Page, Item (73) Assignee should read Samsung Corning Precision Glass Co., Ltd., Gumi (KR)

Signed and Sealed this
Seventeenth Day of May, 2011

David J. Kappos
*Director of the United States Patent and Trademark Office*